(12) United States Patent
Tsai et al.

(10) Patent No.: US 7,889,550 B1
(45) Date of Patent: Feb. 15, 2011

(54) CONTROL DRIVER FOR MEMORY AND RELATED METHOD

(75) Inventors: Yu-Hsiung Tsai, Hsinchu (TW); Po-Hao Huang, Taichung (TW); Yin-Chang Chen, Hsinchu County (TW)

(73) Assignee: eMemory Technology Inc., Hsinchu Science Park, Hsin-Chu (TW)

( * ) Notice: Subject to any disclaimer, the term of this patent is extended or adjusted under 35 U.S.C. 154(b) by 57 days.

(21) Appl. No.: 12/541,976

(22) Filed: Aug. 17, 2009

(51) Int. Cl.
*G11C 16/00* (2006.01)

(52) U.S. Cl. .......................... 365/185.02; 365/185.23; 365/189.11

(58) Field of Classification Search ............. 365/185.02
See application file for complete search history.

(56) References Cited

U.S. PATENT DOCUMENTS 5,513,147 A * 4/1996 Prickett, Jr. ............ 365/230.06
6,044,020 A * 3/2000 Chung et al. ............ 365/185.23
6,813,216 B2 * 11/2004 Lee ........................ 365/230.06
7,468,916 B2    12/2008 Chen

* cited by examiner

*Primary Examiner*—Tan T. Nguyen
(74) *Attorney, Agent, or Firm*—Winston Hsu; Scott Margo

(57) ABSTRACT

A control driver for non-volatile memory includes a driving circuit, a level shift up circuit, and a select circuit. The select circuit receives a plurality of decoding signals, asserts a select signal when all of the decoding signals are asserted, and does not assert the select signal when any of the decoding signals is not asserted. The level shift up circuit receives the select signal, outputs the pull-up signal at a first voltage when the select signal is asserted, and outputs the pull-up signal at a second voltage when the select signal is not asserted. The driving circuit has a pull-up transistor for pulling up a control line signal according to the pull-up signal, and a pull-down transistor for pulling down the control line signal according to the pull-up signal.

9 Claims, 9 Drawing Sheets

| | PU1 | ZCL | ZCLV | VBC | VP5 | VZC_PSUB |
|---|---|---|---|---|---|---|
| A | 0 | 5.5 | 5.5 | 3.3 | 5.5 | 5.5 |
| B | 0 | 3.3 | 3.3 | 3.3 | 5.5 | 5.5 |

| | PU2 | ZCL | ZCLV | VBC | VP5 | VZC_PSUB |
|---|---|---|---|---|---|---|
| C | 5 | 3.3 | 5.5 | 3.3 | 5.5 | 5.5 |
| D | 5 | 3.3 | 3.3 | 3.3 | 5.5 | 5.5 |

CONTROL DRIVER FOR MEMORY AND RELATED METHOD

BACKGROUND OF THE INVENTION

1. Field of the Invention

The present invention relates to row decoders for memory, and more particularly, to a row decoder and related method with reduced program disturb and layout area.

2. Description of the Prior Art

Flash memory is a type of non-volatile memory commonly employed in memory cards, flash drives, and portable electronics for providing data storage and transfer. Flash memory may be electrically written to, erased, and reprogrammed to allow deletion of data and writing of new data. Some advantages of flash memory include fast read access time, and shock resistance. Flash memory is also very resistant to pressure and temperature variations.

Please refer to FIG. 1, which is a diagram of a row driving circuit 10. To program a memory unit of flash memory, an address of the memory unit may be decoded by a decoder to select a memory block comprising the memory unit. The address may be further decoded to determine a word line of the memory unit. The row driving circuit 10 is utilized for driving the memory unit of the memory block to read, write, or erase data from or to the memory unit. The row driving circuit 10 comprises eight NOR gates 100 for receiving a memory block selection signal [XPA, XPB, XPC], eight level shift up circuits 121, eight level shift down circuits 122, eight pull-up transistors MP, eight pull down transistors MN, and eight reset transistors M_RESET. The row driving circuit 10 outputs an eight-bit word line selection signal ZWL<7:0> for selecting the word line of the memory unit to be accessed.

Please refer to FIG. 2, which is a diagram of one of the level shift up circuits 121. Each level shift up circuit 121 may include a first NMOS transistor MN1, a first PMOS transistor MP1, a second NMOS transistor MN2, a second PMOS transistor MP2, and an inverter 200. Input voltage to the level shift up circuit 121 is received at a gate terminal of the first NMOS transistor MN1. The input voltage is also inverted by the inverter 200, and output to a gate terminal of the second NMOS transistor MN2. The first NMOS transistor MN1 and the first PMOS transistor MP1 act as an inverter, and output a first inverted signal to a gate terminal of the second PMOS transistor MP2. Likewise, the second NMOS transistor MN2 and the second PMOS transistor MP2 act as an inverter, and output a second inverted signal to a gate terminal of the first PMOS transistor MP1. Thus, if the input voltage is high, output voltage of the level shift up circuit 121 taken at drains of the second NMOS transistor MN2 and the second PMOS transistor MP2 will be a high voltage VPP. If the input voltage is low, then the output voltage will be a low voltage, such as ground.

Please refer to FIG. 3, which is a diagram of one of the level shift down circuits 122. Each level shift down circuit 122 may include a first NMOS transistor MN1, a first PMOS transistor MP1, a second NMOS transistor MN2, a second PMOS transistor MP2, and an inverter 200. Input voltage to the level shift down circuit 122 is received at a gate terminal of the first PMOS transistor MP1. The input voltage is also inverted by the inverter 200, and output to a gate terminal of the second PMOS transistor MP2. The first NMOS transistor MN1 and the first PMOS transistor MP1 act as an inverter, and output a first inverted signal to a gate terminal of the second NMOS transistor MN2. Likewise, the second NMOS transistor MN2 and the second PMOS transistor MP2 act as an inverter, and output a second inverted signal to a gate terminal of the first NMOS transistor MN1. Thus, if the input voltage is low, output voltage of the level shift down circuit 122 taken at drains of the second NMOS transistor MN2 and the second PMOS transistor MP2 will be a low voltage VBB. If the input voltage is high, then the output voltage will be a high voltage VDD. The high voltage VDD may be equal to or lower than the high voltage VPP.

Two cases exist for the input voltage to the level shift up circuit 121 and the level shift down circuit 122. The input voltage may be high. Thus, the level shift up circuit 121 may output the high voltage VPP to the pull-up transistor MP, and the level shift down circuit 122 may output the high voltage VDD to the pull-down transistor MN. If the input voltage is low, the level shift up circuit 121 may output the low voltage, e.g. ground, and the level shift down circuit 122 may output the low voltage VBB. Thus, the word line selection signal ZWL<7:0> will have seven VPP outputs and one XWV output. For example, the word line selection signal ZWL<1> may have voltage of the signal XWV<1>, and the word line selection signals ZWL<7:2>, ZWL<0> may have voltage of the high voltage VPP. This is shown in FIG. 4. A reset signal ZXWV<7:0> may be utilized to control the reset transistor M_RESET.

The row driving circuit 10 uses the level shift up circuit 121 and the level shift down circuit 122, as well as the pull-up transistor MP, the pull-down transistor MN, and the reset transistor M_RESET. This architecture is complex, and takes more chip area.

SUMMARY OF THE INVENTION

According to an embodiment of the present invention, a control driver for non-volatile memory comprises a first driving circuit, a first level shift up circuit, and a first select circuit. The first driving circuit comprises a first pull-up transistor for pulling up a first control line signal according to a first pull-up signal, and a first pull-down transistor for pulling down the first control line signal according to the first pull-up signal. The first pull-up transistor comprises a first terminal for pulling the first control line signal up to approximately a first control line voltage, a second terminal for receiving the first control line voltage, and a control terminal for receiving the first pull-up signal, and turning on the first pull-up transistor when voltage of the first pull-up signal is less than voltage of the first control line voltage. The first pull-down transistor comprises a first terminal coupled to the first terminal of the first pull-up transistor for pulling the first control line signal to approximately a low power supply voltage, a second terminal for receiving the low power supply voltage, and a control terminal for receiving the first pull-up signal, and turning on the first pull-down transistor when voltage of the first pull-up signal is greater than the low power supply voltage. The first level shift up circuit has an output terminal directly coupled to the control terminal of the first pull-up transistor and the control terminal of the first pull-down transistor for outputting the first pull-up signal. The first level shift up circuit receives a first select signal, outputs the first pull-up signal at a first voltage when the first select signal is asserted, and outputs the first pull-up signal at a second voltage when the first select signal is not asserted. The first select circuit is coupled to the first level shift up circuit for outputting the first select signal. The first select circuit receives a plurality of first decoding signals, asserts the first select signal when all of the first decoding signals are asserted, and does not assert the first select signal when any of the first decoding signals is not asserted.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
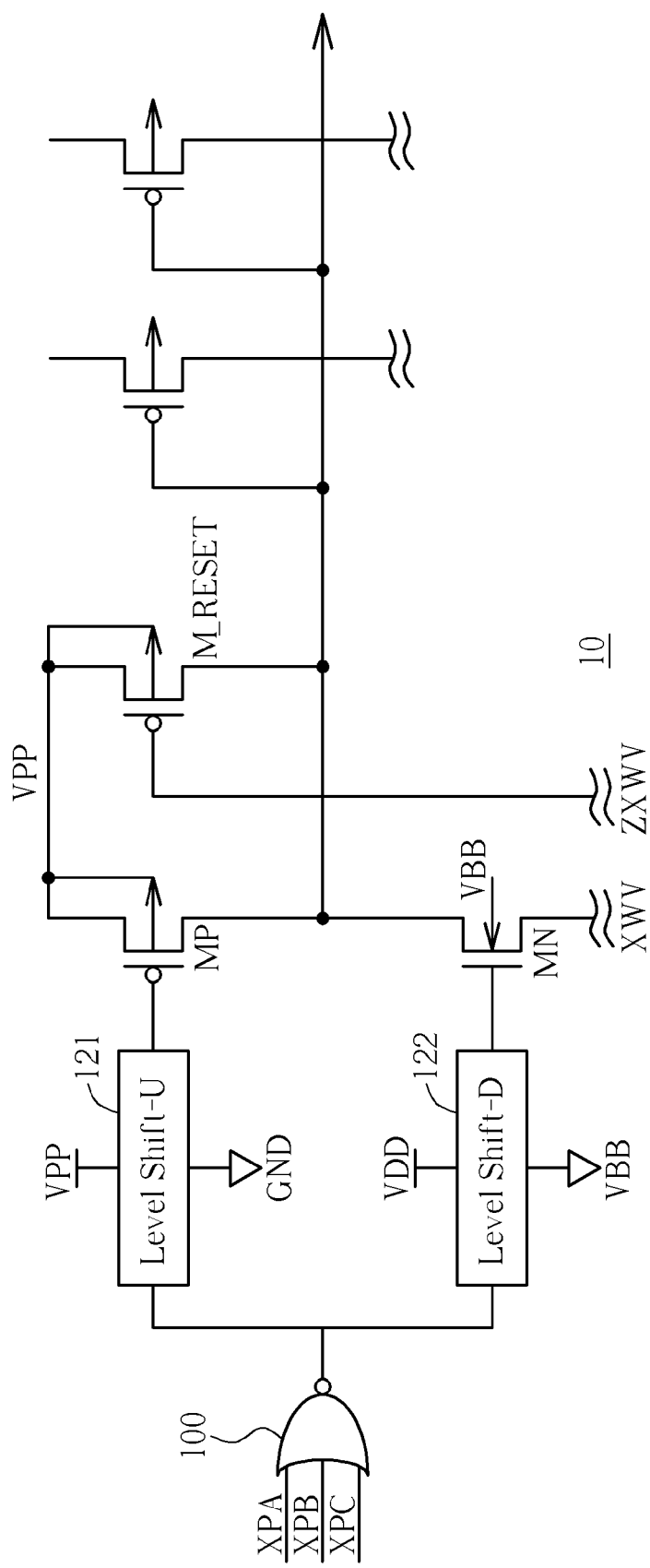
FIG. 1 is a diagram of a row driving circuit.
Figure 2:
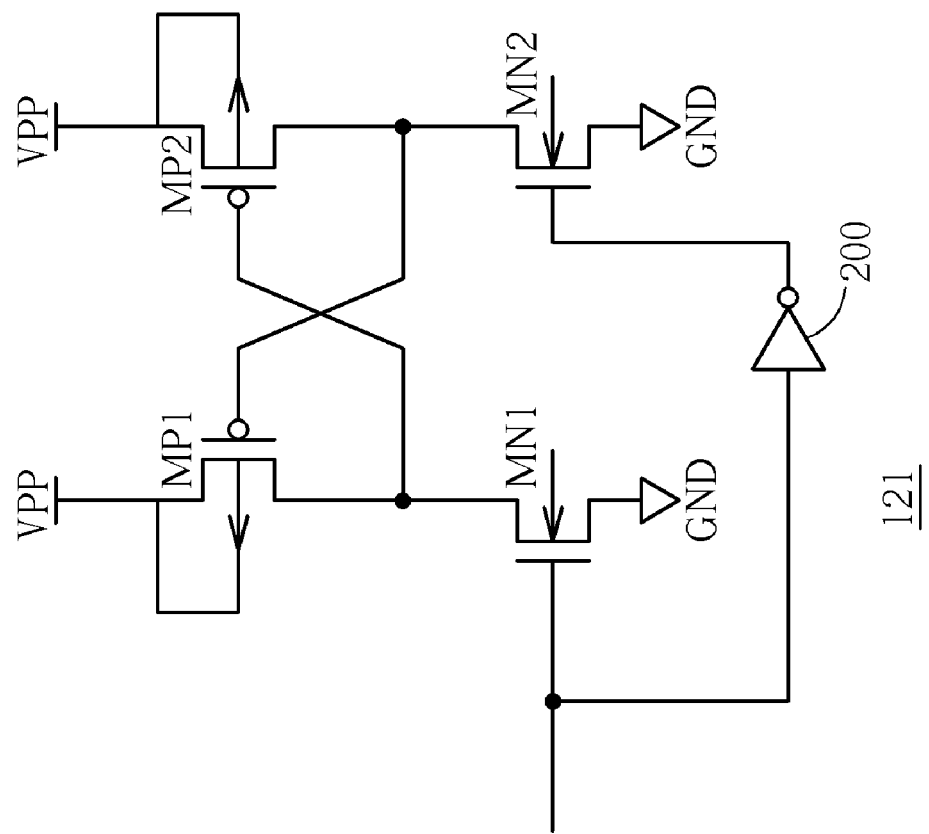
FIG. 2 is a diagram of a level shift up circuit of the row driving circuit of FIG. 1.
Figure 3:
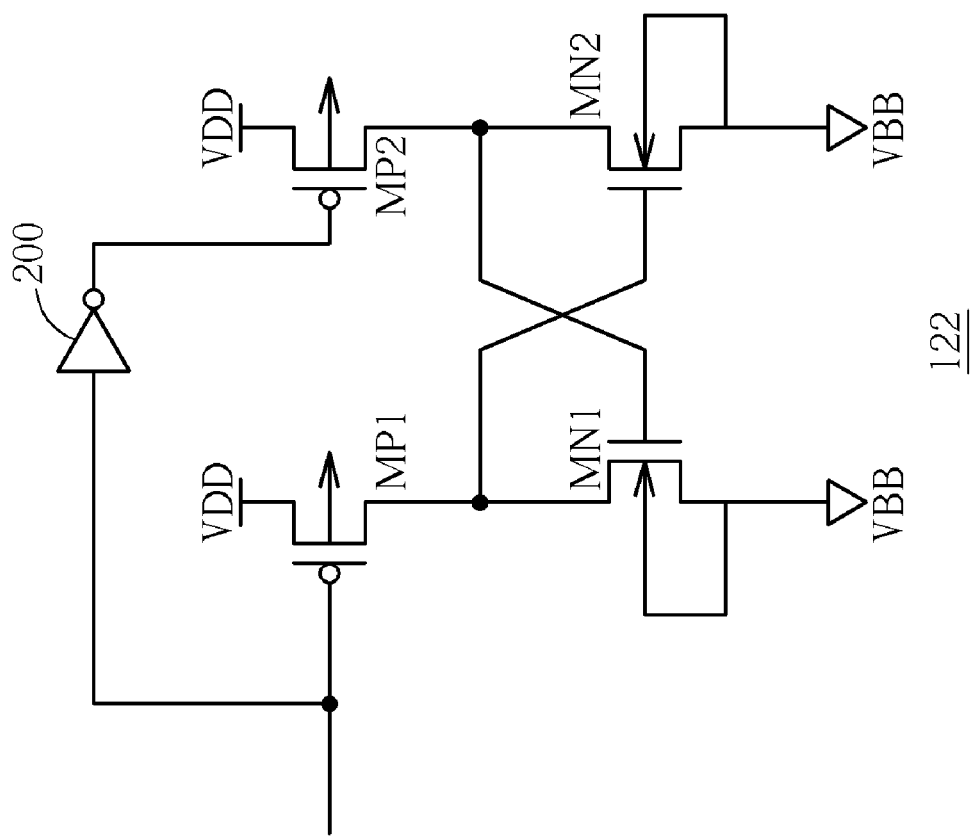
FIG. 3 is a diagram of a level shift down circuit of the row driving circuit of FIG. 1.
Figure 4:
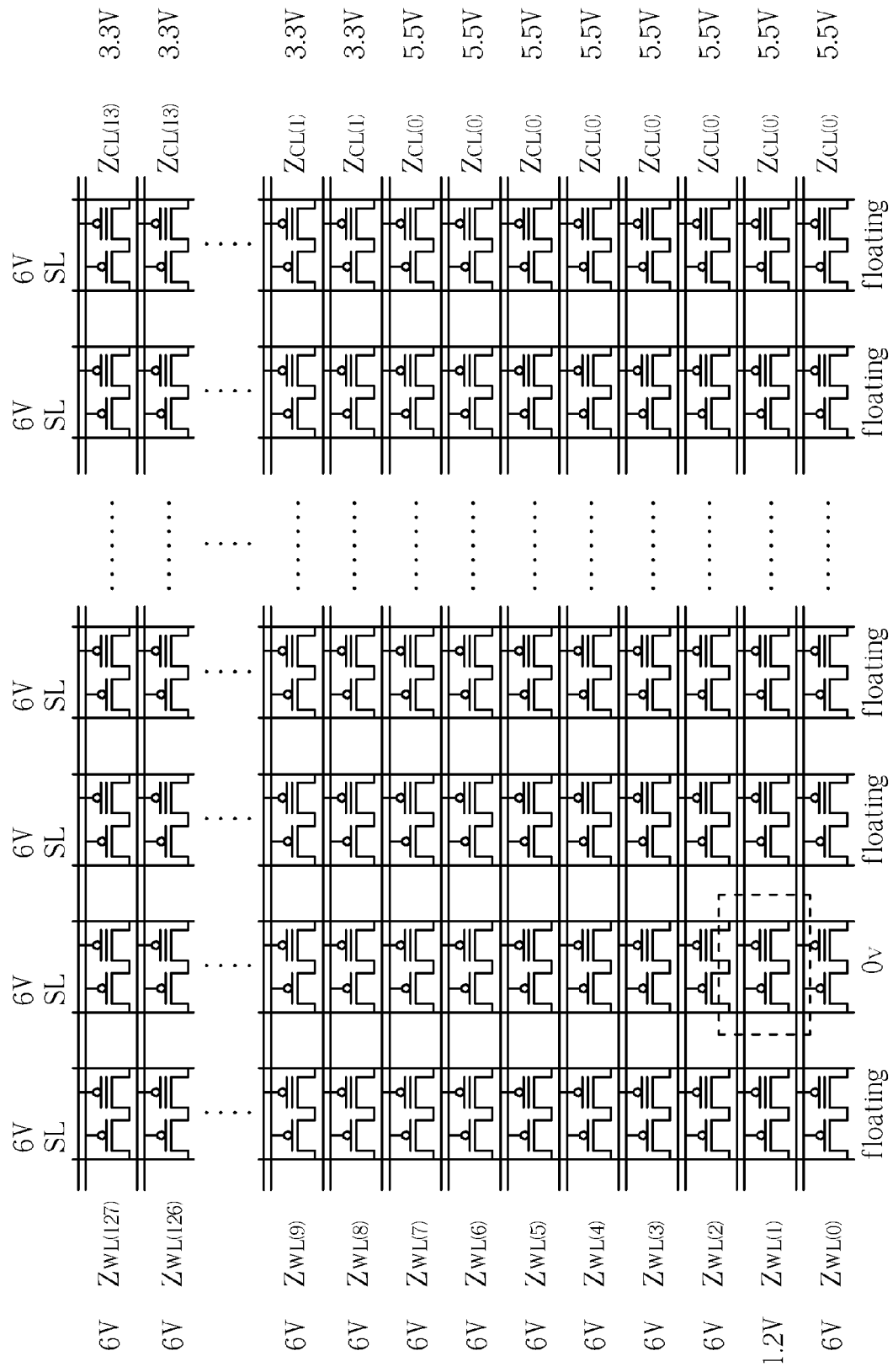
FIG. 4 is a diagram illustrating program disturb in a flash memory unit driven by the row driving circuit of FIG. 1.
Figure 5:
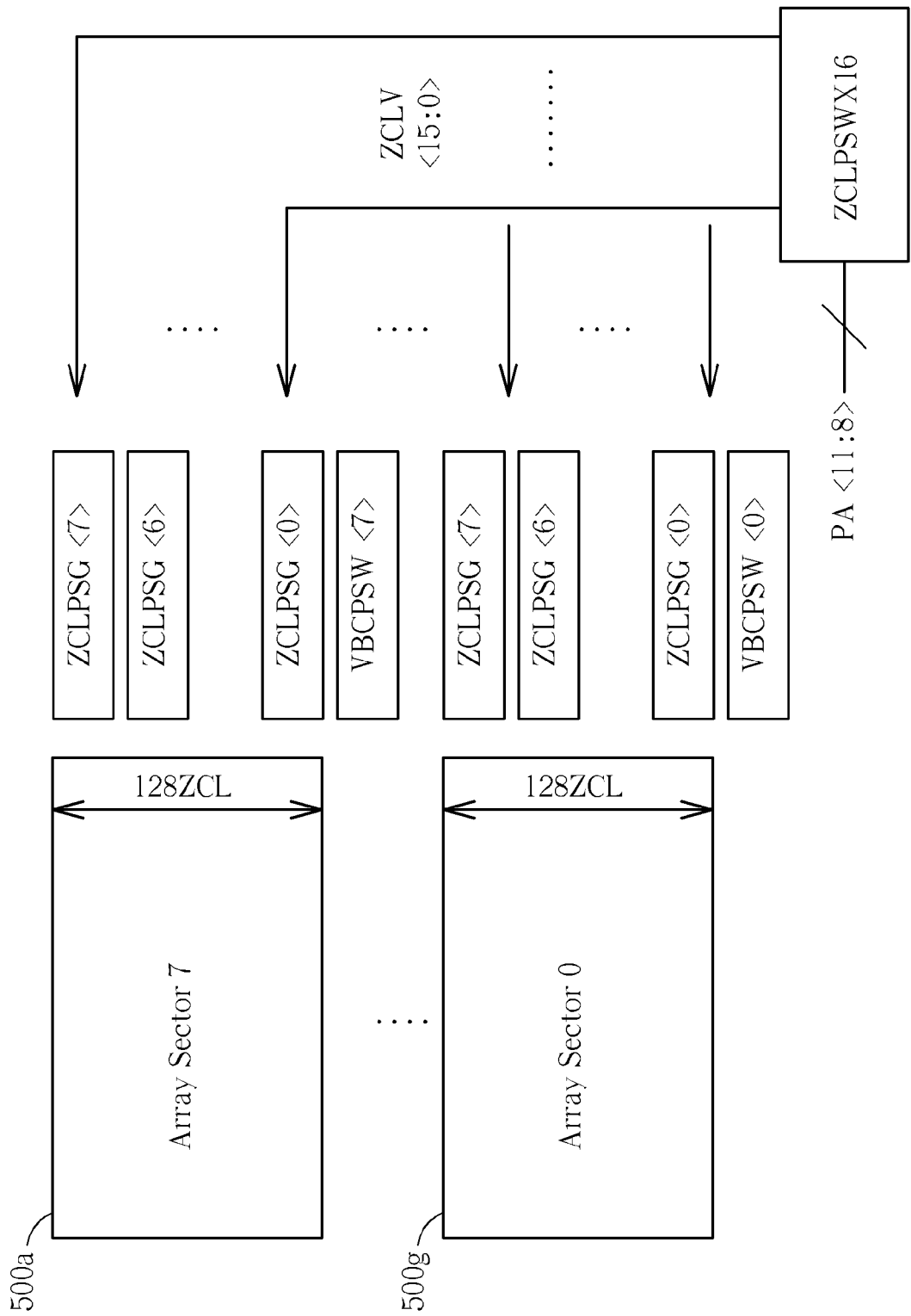
FIG. 5 is a diagram of a control line architecture according to embodiments of the present invention.

Please refer to FIG. 5, which is a diagram of a control line architecture according to embodiments of the present invention. The control line architecture comprises a plurality of memory array sectors 500a, ..., 500g. Each block of each memory array sector 500a, ..., 500g may be selected through a decoding signal PA<14:8>. The selection signal PA<14:8> may be considered a control line decode signal PA<11:8> and a sector decode signal PA<14:12>. The control line decode signal PA<11:8> may be utilized to generate a control line selection signal ZCLV<15:0>.

Figure 6:
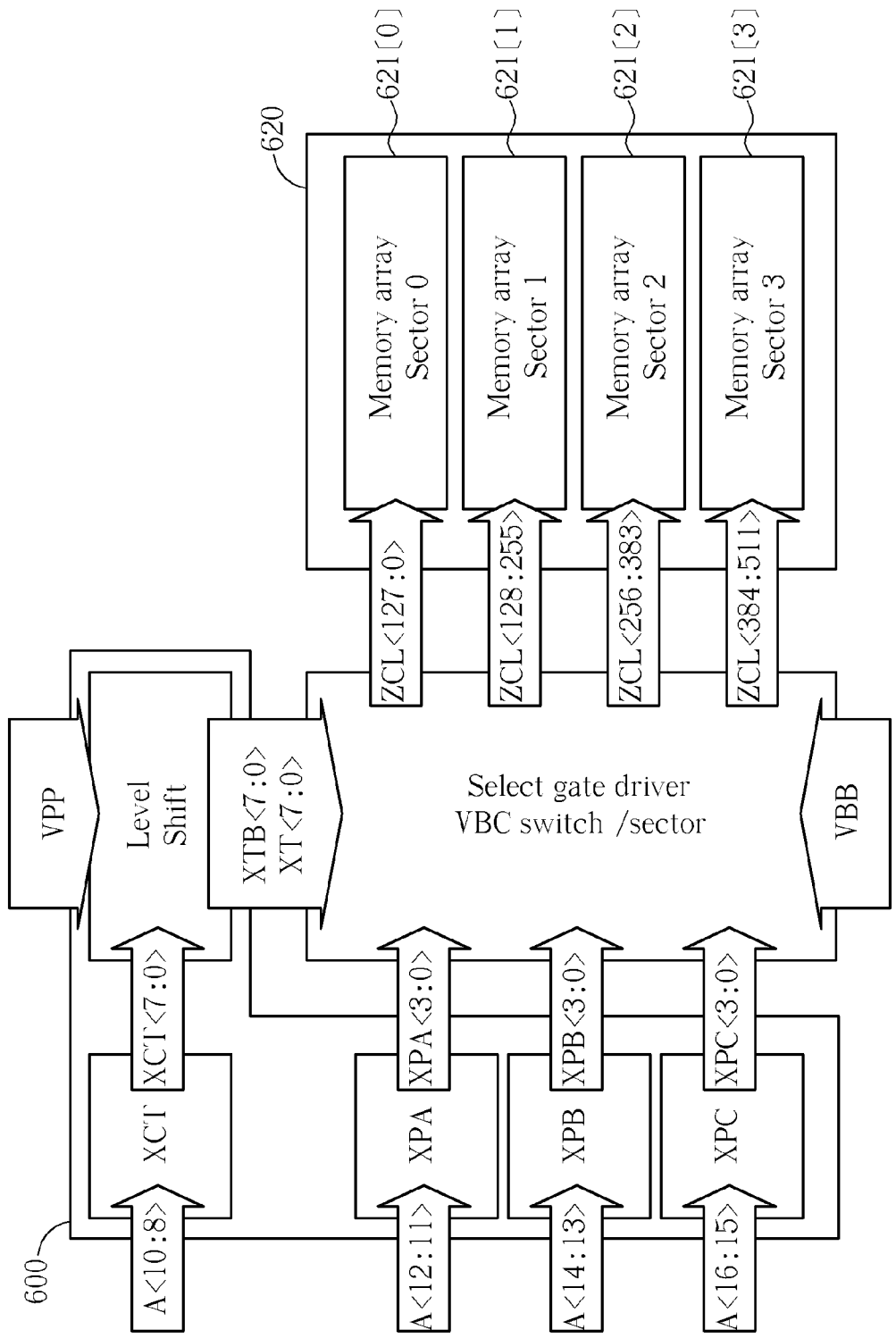
FIG. 6 is a block diagram of gate driver selection according to the embodiments.

Please refer to FIG. 6, which is a block diagram of gate driver selection according to the embodiments. A memory array 620 may comprise a plurality of memory array sectors 621 [0], 621 [1], 621[2], 621[3], whose blocks may be selected through a plurality of control line selection signals ZCL<127:0>, ZCL<128:255>, ZCL<256:383>, ZCL<384:511>, respectively. The control line selection signals ZCL<0:511> may be generated through use of a pre-decoder 600, which may receive a decoding signal A<8:16>, and may generate memory block selection signals XPA<3:0>, XPB<3:0>, XPC<3:0>, as well as control signals XCT<7:0>, based on the decoding signal A<8:16>. The control signals XCT<7:0> may be level shifted to generate level shifted control signals XT<7:0> and bar level shifted control signals XTB<7:0>. Then, the control line selection signals ZCL<0:511> may be generated based on the memory block selection signals XPA<3:0>, XPB<3:0>, XPC<3:0> and the level shifted control signals XT<7:0> and inverse level shifted control signals XTB<7:0>.

Figure 7:
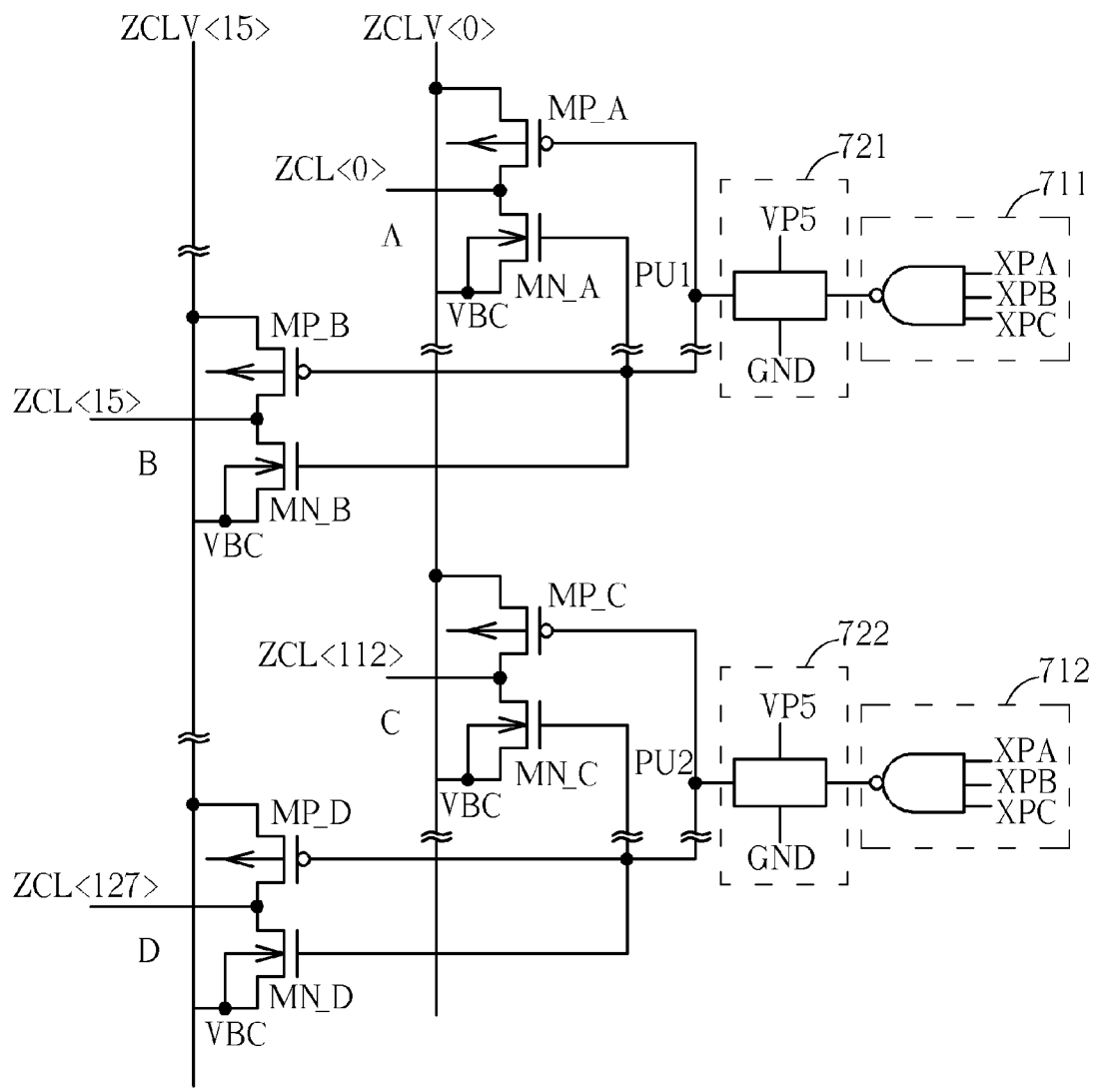
FIG. 7 is a diagram of a control driver in program mode according to one embodiment of the present invention.

Please refer to FIG. 7, which is a diagram of a plurality of row driving circuits in program mode according to one embodiment of the present invention. A first row driving circuit "row" may comprise a first driving circuit A, a second driving circuit B, a first level shift up circuit 721 coupled to the first and second driving circuits A, B for outputting a first pull-up signal PU1, and a first select circuit 711 coupled to the first level shift up circuit 721 for outputting a first select signal. The first select circuit 711 may be an AND logic gate or a NAND logic gate. A second row driving circuit "row" may comprise a third driving circuit C, a fourth driving circuit D, a second level shift up circuit 722 coupled to the third and fourth driving circuits C, D for outputting a second pull-up signal PU2, and a second select circuit 712 coupled to the second level shift up circuit 722 for outputting a second select signal. The second select circuit 712 may be an AND logic gate or a NAND logic gate. The first driving circuit A may comprise a first pull-up transistor MP_A for pulling up a first control line signal ZCL<0> according to a first pull-up signal PU1. The first pull-up transistor may be a P-type MOS (PMOS) transistor comprising a first terminal, e.g. a drain terminal, for outputting the first control line signal ZCL<0> at approximately a first control line voltage ZCLV<0>, a second terminal, e.g. a source terminal, for receiving the first control line voltage ZCLV<0>, and a control terminal, e.g. a gate terminal, for receiving the first pull-up signal PU1, and turning on the first pull-up transistor MP_A when voltage of the first pull-up signal PU1 is less than voltage of the first control line voltage ZCLV<0>. The first driving circuit A may also comprise a first pull-down transistor MN_A for pulling down the first control line signal ZCL<0> according to the first pull-up signal PU1. The first pull-down transistor MN_A may be an N-type MOS (NMOS) transistor comprising a first terminal, e.g. a drain terminal, coupled to the first terminal of the first pull-up transistor MP_A for outputting the first control line signal ZCL<0> at approximately a low power supply voltage VBC, a second terminal, e.g. a source terminal, for receiving the low power supply voltage VBC, and a control terminal, e.g. a gate terminal, for receiving the first pull-up signal PU1, and turning on the first pull-down transistor MN_A when voltage of the first pull-up signal PU1 is greater than the low power supply voltage VBC. The first level shift up circuit 721 may have an output terminal directly coupled to the gate of the first pull-up transistor MP_A and the gate of the first pull-down transistor MN_A of the first driving circuit A for outputting the first pull-up signal PU1. The output terminal of the first level shift up circuit 721 may also be directly coupled to the gate of the second pull-up transistor MP_B and the gate of the second pull-down transistor MN_B of the second driving circuit B. The first level shift up circuit 721 may receive the first select signal. When the first select signal is asserted, the first level shift up circuit 721 may output the first pull-up signal PU1 at a first voltage GND, e.g. 0V. When the first select signal is not asserted, the first level shift up circuit 721 may output the first pull-up signal PU1 at a second voltage VP5, e.g. 5.5V. The first select circuit 711 may be coupled to the first level shift up circuit 721 for outputting the first select signal. The first select circuit 711 may receive a plurality of first decoding signals XPA, XPB, XPC. When all of the first decoding signals XPA, XPB, XPC are asserted, the first select circuit 711 may assert the first select signal. When any of the first decoding signals XPA, XPB, XPC is not asserted, the first select circuit 711 may not assert the first select signal. Regarding "assertion" of the first select signal, if the first select circuit 711 is an AND logic gate, "assertion" may mean outputting a logic high signal, whereas if the first select circuit 711 is a NAND logic gate, "assertion" may mean outputting a logic low signal, and likewise for the second select circuit 721 and the second select signal. In the embodiment, "assertion" may be related to "selection" of a row driving row.

As shown in FIG. 7, for an architecture having 128 control line signals ZCL<0:127>, 16 control line voltages ZCLV<0:15> and 8 driving circuit "rows" may be utilized in an array to generate the control line signals ZCL<0:127>. For example, a second driving circuit B may be utilized for generating a second control line signal ZCL<15>, a third driving circuit C may be utilized for generating a third control line signal ZCL<112>, and a fourth driving circuit D may be utilized for generating a fourth control line signal ZCL<127>. The first pull-up signal PU1 may be utilized for controlling control line signals ZCL<0:15>, and a second pull-up signal PU2 may be utilized for controlling control line signals ZCL<112:127>. Then, the pull-up signal for each driving circuit "row" may be selected by the decoding signals XPA, XPB, XPC. Each combination of the decoding signals XPA, XPB, XPC, which may be binary signals, may then correspond to one of the driving circuit "rows". Thus, as shown in FIG. 7, in program mode, through assertion of one driving circuit "row" and one control line voltage ZCLV<0:15>, one driving circuit may generate a control line signal at the control line voltage, and all other driving circuits may generate a control line signal at the low power supply voltage VBC. For example, in FIG. 7, the first driving circuit A is selected through the decoding signals XPA, XPB, XPC and the first control line voltage ZCLV<0>, such that the first control line signal ZCL<0> is output at the first control line voltage ZCLV<0>, e.g. 5.5V. The second driving circuit B, the third driving circuit C, and the fourth driving circuit D all output the low power supply voltage, e.g. 3.3V. So, although the second driving circuit B receives the first pull-up voltage PU1, which is asserted, the second control line voltage ZCLV<15> is not asserted, e.g. is 3.3V, so the second driving circuit B outputs the second control line voltage ZCLV<15>, e.g. 3.3V. The third driving circuit C receives the first control line voltage ZCLV<0>, which is asserted, e.g. is 5.5V. However, the second pull-up voltage PU2 is not asserted, so the pull-up transistor MP_C of the third driving circuit C is shut off, the pull-down transistor MN_C of the third driving circuit C is turned on, and the third control line signal ZCL<112> is outputted as the low power supply voltage VBC, e.g. 3.3V. In the above embodiment, the low power supply voltage VBC and the non-asserted control line voltage ZCL are the same, e.g. 3.3V, however the lower power supply voltage VBC and the non-asserted control line voltage ZCL may also be different.

Figure 8:
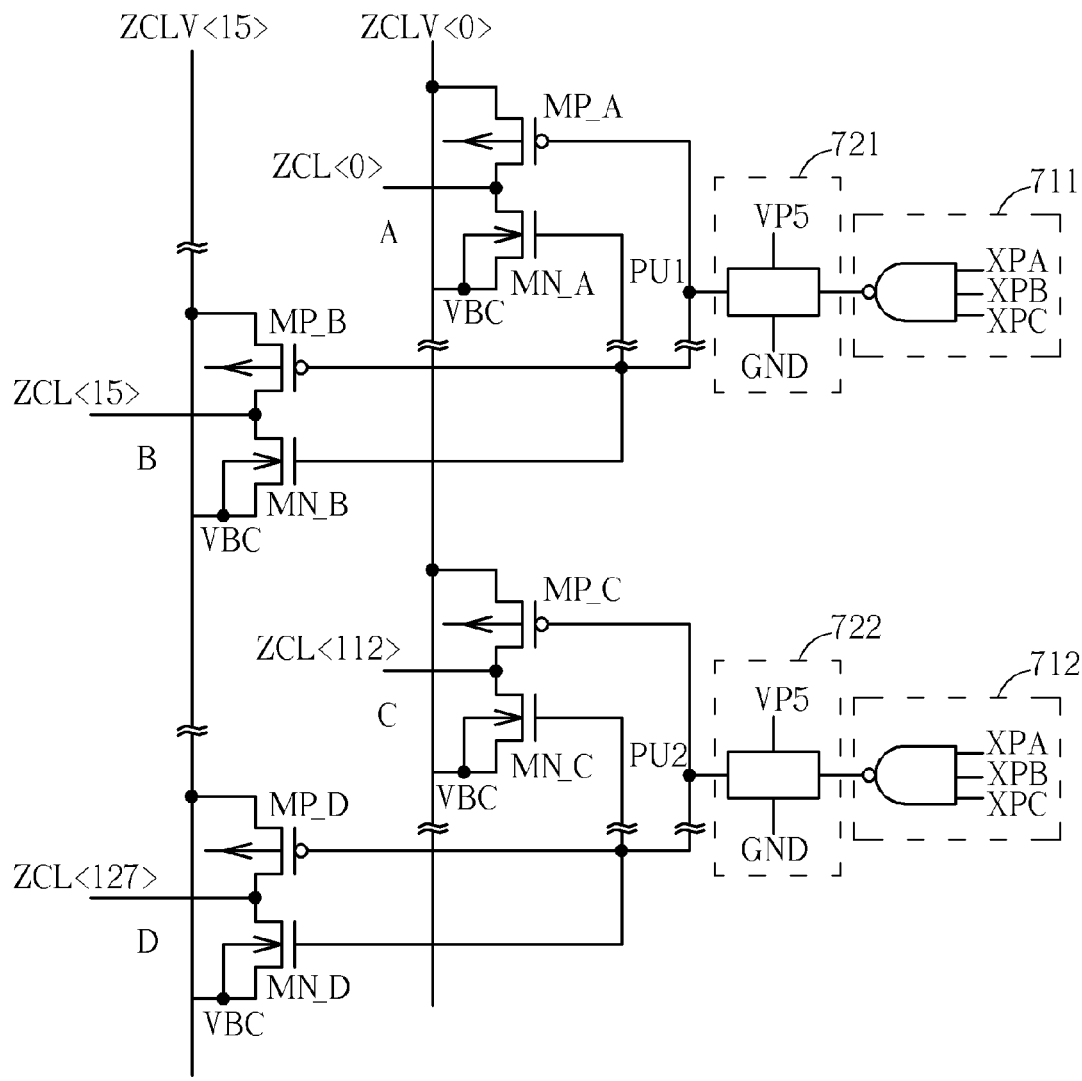
FIG. 8 is a diagram of the control driver of FIG. 7 in read mode.

In read mode, as shown in FIG. 8, the low power supply voltage VBC may be lowered to 0V, and operation of the row driving circuits may proceed as follows. When reading data from memory, the control line signals ZCL<0:127> may be held at a read voltage, e.g. 3.3V. Thus, the control line voltages ZCLV<0:15> may be the read voltage, and the pull-up transistors MP_A, MP_B, MP_C, MP_D of the driving circuits A, B, C, D, respectively, may be turned on to pull the control line signals ZCL<0:127> up to the read voltage. Thus, the pull-up signals PU1, PU2 may be held at the first voltage GND, e.g. 0V, for turning on the pull-up transistors MP_A, MP_B, MP_C, MP_D and turning off the pull-down transistors MN_A, MN_B, MN_C, MN_D.

Figure 9:
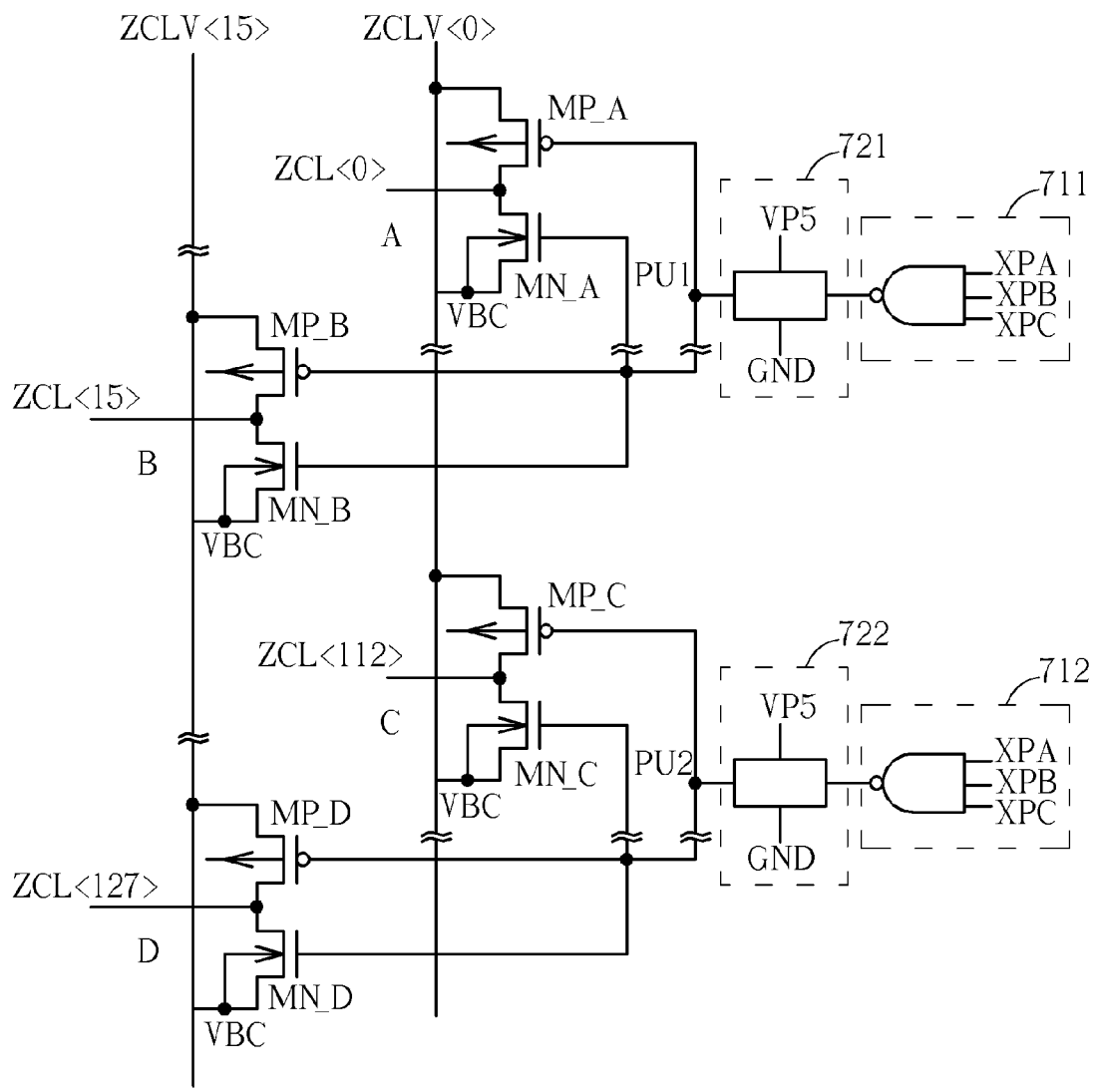
FIG. 9 is a diagram of the control driver of FIG. 7 in erase mode.

In erase mode, as shown in FIG. 9, the low power supply voltage VBC may be lowered to −6V, and operation of the row driving circuits may proceed as follows. When erasing data of the memory, the control line signals ZCL<0:127> may be held at an erase voltage, e.g. −6V. Thus, the pull-down transistors MN_A, MN_B, MN_C, MN_D may be turned on to pull the control line signals ZCL<0:127> down to the low power supply voltage VBC. To keep the pull-up transistors MP_A, MP_B, MP_C, MP_D turned off, the pull up signals PU1, PU2 may be held at the first voltage GND, e.g. 0V, and the control line voltages ZCLV<0:15> may also be held at a second voltage, e.g. 0V. Thus, because the source voltages of the pull-up transistors MP_A, MP_B, MP_C, MP_D are not higher than the gate voltages, the pull-up transistors MP_A, MP_B, MP_C, MP_D remain turned off.

In summary, the control driver embodiments described above and illustrated in the figures utilize a single level shift circuit, e.g. a level shift up circuit, a pull-up transistor, and a pull-down transistor, making the control driver simpler and reducing chip area thereof.

Those skilled in the art will readily observe that numerous modifications and alterations of the device and method may be made while retaining the teachings of the invention.

What is claimed is:

1. A control driver for non-volatile memory, the control driver comprising:
   a first driving circuit comprising:
   a first pull-up transistor for pulling up a first control line signal according to a first pull-up signal, the first pull-up transistor comprising:
   a first terminal for pulling the first control line signal up to approximately a first control line voltage;
   a second terminal for receiving the first control line voltage; and
   a control terminal for receiving the first pull-up signal, and turning on the first pull-up transistor when voltage of the first pull-up signal is less than voltage of the first control line voltage;
   a first pull-down transistor for pulling down the first control line signal according to the first pull-up signal, the first pull-down transistor comprising:
   a first terminal coupled to the first terminal of the first pull-up transistor for pulling the first control line signal to approximately a low power supply voltage;
   a second terminal for receiving the low power supply voltage; and
   a control terminal for receiving the first pull-up signal, and turning on the first pull-down transistor when voltage of the first pull-up signal is greater than the low power supply voltage;
   a first level shift up circuit having an output terminal directly coupled to the control terminal of the first pull-up transistor and the control terminal of the first pull-down transistor for outputting the first pull-up signal, the first level shift up circuit receiving a first select signal, outputting the first pull-up signal at a first voltage when the first select signal is asserted, and outputting the first pull-up signal at a second voltage when the first select signal is not asserted; and
   a first select circuit coupled to the first level shift up circuit for outputting the first select signal, the first select circuit receiving a plurality of first decoding signals, asserting the first select signal when all of the first decoding signals are asserted, and not asserting the first select signal when any of the first decoding signals is not asserted.

2. The control driver of claim 1, wherein the first pull-up transistor is a P-type MOS transistor, and the first pull-down transistor is an N-type MOS transistor.

3. The control driver of claim 1, wherein the first select circuit is a NAND logic gate, and the first voltage is lower than the second voltage.

4. The control driver of claim 1, further comprising:
   a second driving circuit coupled to the first level shift up circuit, the second driving circuit comprising:
   a second pull-up transistor for pulling up a second control line signal according to the first pull-up signal, the second pull-up transistor comprising:
   a first terminal for outputting the second control line signal at approximately a second control line voltage;

a second terminal for receiving the second control line voltage; and a control terminal directly coupled to the output terminal of the first level shift up circuit for receiving the first pull-up signal, and turning on the second pull-up transistor when voltage of the first pull-up signal is less than voltage of the second control line voltage;

a second pull-down transistor for pulling down the second control line signal according to the first pull-up signal, the second pull-down transistor comprising:

a first terminal coupled to the first terminal of the second pull-up transistor for outputting the second control line signal at approximately a low power supply voltage;

a second terminal for receiving the low power supply voltage; and a control terminal directly coupled to the output terminal of the first level shift up circuit for receiving the first pull-up signal, and turning on the second pull-down transistor when voltage of the first pull-up signal is greater than the low power supply voltage.

5. The control driver of claim 4, wherein the first select circuit is a NAND logic gate, and the first voltage is lower than the second voltage.

6. The control driver of claim 4, further comprising:

a third driving circuit comprising:

a third pull-up transistor for pulling up a third control line signal according to a second pull-up signal, the third pull-up transistor comprising:

a first terminal for outputting the third control line signal at approximately the first control line voltage [I think this should be "first", because the third driving circuit is on the same column of the array as the first driving circuit (See FIG. 7, MP_C receives ZCLV<0>)];

a second terminal for receiving the first control line voltage; and a control terminal for receiving the second pull-up signal, and turning on the third pull-up transistor when voltage of the second pull-up signal is less than voltage of the first control line voltage;

a third pull-down transistor for pulling down the third control line signal according to the second pull-up signal, the third pull-down transistor comprising:

a first terminal coupled to the first terminal of the third pull-up transistor for outputting the third control line signal at approximately the low power supply voltage;

a second terminal for receiving the low power supply voltage; and a control terminal for receiving the second pull-up signal, and turning on the third pull-down transistor when voltage of the second pull-up signal is greater than the low power supply voltage;

a second level shift up circuit having an output terminal directly coupled to the control terminal of the third pull-up transistor and the control terminal of the third pull-down transistor for outputting the second pull-up signal, the second level shift up circuit receiving a second select signal, outputting the second pull-up signal at the first voltage when the second select signal is asserted, and outputting the second pull-up signal at the second voltage when the second select signal is not asserted; and a second select circuit coupled to the second level shift up circuit for outputting the second select signal, the second select circuit receiving a plurality of second decoding signals, asserting the second select signal when all of the second decoding signals are asserted, and not asserting the second select signal when any of the second decoding signals is not asserted.

7. The control driver of claim 6, wherein the first select circuit is a NAND logic gate, the second select circuit is a NAND logic gate, and the first voltage is lower than the second voltage.

8. The control driver of claim 1, further comprising:

a third driving circuit comprising:

a third pull-up transistor for pulling up a third control line signal according to a second pull-up signal, the third pull-up transistor comprising:

a first terminal for outputting the third control line signal at approximately the first control line voltage;

a second terminal for receiving the first control line voltage; and a control terminal for receiving the second pull-up signal, and turning on the third pull-up transistor when voltage of the second pull-up signal is less than voltage of the first control line voltage;

a third pull-down transistor for pulling down the third control line signal according to the second pull-up signal, the third pull-down transistor comprising:

a first terminal coupled to the first terminal of the third pull-up transistor for outputting the third control line signal at approximately the low power supply voltage;

a second terminal for receiving the low power supply voltage; and a control terminal for receiving the second pull-up signal, and turning on the third pull-down transistor when voltage of the second pull-up signal is greater than the low power supply voltage;

a second level shift up circuit having an output terminal directly coupled to the control terminal of the third pull-up transistor and the control terminal of the third pull-down transistor for outputting the second pull-up signal, the second level shift up circuit receiving a second select signal, outputting the second pull-up signal at the first voltage when the second select signal is asserted, and outputting the second pull-up signal at the second voltage when the second select signal is not asserted; and a second select circuit coupled to the second level shift up circuit for outputting the second select signal, the second select circuit receiving a plurality of second decoding signals, asserting the second select signal when all of the second decoding signals are asserted, and not asserting the second select signal when any of the second decoding signals is not asserted.

9. The control driver of claim 8, wherein the first select circuit is a NAND logic gate, the second select circuit is a NAND logic gate, and the first voltage is lower than the second voltage.

* * * * *